United States Patent
Chang et al.

(10) Patent No.: US 10,110,251 B2
(45) Date of Patent: Oct. 23, 2018

(54) METHOD AND SYSTEM FOR DATA TRANSMISSION

(71) Applicant: National Chiao Tung University, Hsinchu (TW)

(72) Inventors: Hsie-Chia Chang, Hsinchu (TW); Kuo-Kuang Yen, Changhua County (TW); Yen-Chin Liao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 100 days.

(21) Appl. No.: 15/291,079

(22) Filed: Oct. 12, 2016

(65) Prior Publication Data

US 2018/0048331 A1 Feb. 15, 2018

(30) Foreign Application Priority Data

Aug. 15, 2016 (TW) .............................. 105125889 A (51) Int. Cl.
- H03M 13/00 (2006.01)
- H03M 13/15 (2006.01)
- H04L 1/00 (2006.01)

(52) U.S. Cl.
CPC ........ H03M 13/156 (2013.01); H04L 1/0007 (2013.01); H04L 1/0009 (2013.01); H04L 1/0043 (2013.01)

(58) Field of Classification Search
CPC ........................... H04L 1/0043; H03M 13/156
See application file for complete search history.

(56) References Cited

U.S. PATENT DOCUMENTS

| | | | |
|---|---|---|---|
| 6,307,487 B1 | 10/2001 | Luby | |
| 8,359,511 B2 | 1/2013 | Agarwal | |
| 2010/0103001 A1* | 4/2010 | Shokrollahi | H03M 13/1191 341/94 |
| 2014/0348049 A1* | 11/2014 | Kim | H04W 4/06 370/312 |

OTHER PUBLICATIONS

Michael Luby, "LT Codes," Proceedings of the 43 rd Annual IEEE Symposium on Foundations of Computer Science, Nov. 2002, pp. 271-280.
Sorensen et al., "Design and Analysis of LT Codes with Decreasing Ripple Size," IEEE Transactions on Communications, Nov. 2012, pp. 3191-3197.
Maatouk et al., "Analysis of the Second Moment of the LT Decoder," IEEE Transactions on Information Theory, May 2012, pp. 2558-2569.

\* cited by examiner

Primary Examiner — Guy Lamarre
(74) Attorney, Agent, or Firm — JCIPRNET (57) ABSTRACT

A method and a system for data transmission are provided. The method includes: determining a size of a first block and a first degree distribution for a first data transmission according to a parameter which is related to a hardware specification of a receiving node; determining a channel loss rate of a channel between a sending note and the receiving node when completing the first data transmission; determining a size of a second block and a second degree distribution for a second data transmission according to the channel loss rate; and performing, by the sending node and the receiving node, the second data transmission according to the size of the second block and the second degree distribution.

14 Claims, 3 Drawing Sheets

METHOD AND SYSTEM FOR DATA TRANSMISSION

CROSS-REFERENCE TO RELATED APPLICATION

This application claims the priority benefit of Taiwan application serial no. 105125889, filed on Aug. 15, 2016. The entirety of the above-mentioned patent application is hereby incorporated by reference herein and made a part of this specification.

BACKGROUND OF THE INVENTION

Field of the Invention

The invention relates to a data transmission method using LT code.

Description of Related Art

Along with development of network technology, various digital data on network is generated and accumulated in an amazing speed. Through the Internet of things, streaming data generated in real-time further relies on analysis and application provided through high quality communication transmission. Luby transform code (LT Code) is easy to be implemented through software due to its low computation complexity, and when it is implemented in an existing system, it is unnecessary to add too much hardware cost. Since the number of users using a video streaming service is continually increased, to use the LT Code technique to improve image transmission quality is an expected value-added service option.

The LT Code is an error correction coding method used for the image streaming service, and main characteristics thereof are the low computation complexity and rateless, and regarding a packet error or packet loss occurred during the transmission process, it has a mechanism of directly correcting the error without requiring a sending node to resend the packet.

In a coding process of the LT Code, the sending node may divide the data to be sent into K source symbols with a fixed size, and select an arbitrary number (which is greater than 0 and smaller than or equal to K) of the source symbols from the K source symbols to perform encoding, so as to generate encoded symbols for sending. The sending node may repeatedly execute the aforementioned step to generate a plurality of encoded symbols for sending to a receiving node until the receiving node decodes the source symbols. A degree value can be defined as the number of the source symbols contained in one encoded symbol, and can also be defined as the number of the source symbols connected to one encoded symbol. Each degree value i corresponds to a probability, which represents a chance that the degree value i is selected to use i source symbols to generate one encoded symbol, where i and K are all positive integers, and i is greater than 0 and is smaller than or equal to K. A set of probabilities corresponding to all of the degree values (i.e. 1-K) can be referred to as a degree distribution. The degree distribution can be defined as $\Omega=\{\Omega_d; d=1, 2, \ldots K\}$, where $\Omega_i$ is the probability corresponding to the degree value i.

However, the key of good or bad encoding performance of the LT Code lies in a design of the degree distribution. Selection of the degree distribution may influence a decoding performance of the receiving node, which is an important factor that determines whether the receiving node can successfully decode the original data sent by the sending node. In the prior art, the degree distribution is deduced based on larger encoded blocks. However, in an actual application, the smaller encoded blocks have an unexpected effect due to increase of variability caused by a random function.

SUMMARY OF THE INVENTION

The invention is directed to a method and system for data transmission, which are adapted to determine a corresponding degree distribution according to a size of a block selected by a sending node under a Luby transform code (LT Code) architecture, so as to effectively optimize a decoding effectively and decoding complexity of a receiving node.

The invention provides a data transmission method, which is adapted to a data transmission system using a LT Code to implement communication, and the data transmission method includes receiving a parameter from a receiving node by using a sending node when the sending node and the receiving node perform a first data transmission, where the parameter is related to a hardware specification of the receiving node; determining a size of a first block and a first degree distribution corresponding to the size of the first block by the sending node according to the parameter, where the first block includes a plurality of first source symbols; generating a plurality of first encoded symbols from the first block by the sending node according to the first block and the first degree distribution, and transmitting the first encoded symbols to the receiving node; sending a notification message to the sending node by the receiving node to notify the sending node to end the first data transmission when the receiving node receives a plurality of second encoded symbols in the first encoded symbols from the sending node, and the receiving node decodes the first source symbols according to the second encoded symbols; determining a size of a second block and a second degree distribution corresponding to the size of the second block by the sending node according to the number of the sent first encoded symbols and a simulation value corresponding to the size of the first block when the sending node receives the notification message, and transmitting the second degree distribution to the receiving node; and performing a second data transmission by the sending node and the receiving node by using the second degree distribution.

In an embodiment of the invention, the simulation value is generated by the sending node in advance through statistics, and the simulation value represents the number of the second encoded symbols required by the receiving node for decoding the first source symbols of the first block.

In an embodiment of the invention, the step of determining the size of the second block and the second degree distribution corresponding to the size of the second block according to the number of the sent first encoded symbols and the simulation value corresponding to the size of the first block further includes: calculating a channel loss rate of a channel between the sending node and the receiving node by the sending node according to the number of the sent first encoded symbols and the simulation value corresponding to the size of the first block; and determining the size of the second block by the sending node according to the channel loss rate, and determining the second degree distribution according to the size of the second block.

In an embodiment of the invention, the sending node pre-stores a plurality of degree distributions in a look-up table of the sending node, where the step of determining the size of the second block according to the channel loss rate, and determining the second degree distribution according to the size of the second block includes determining the second degree distribution by the sending node from the look-up table according to the size of the second block.

In an embodiment of the invention, the step of determining the size of the second block by the sending node according to the channel loss rate, and determining the second degree distribution according to the size of the second block includes obtaining the second degree distribution by the sending node according to a ripple variation function and an expected value function, where the ripple variation function is related to the number of third source symbols in a plurality of second source symbols of the second block decoded by the receiving node, and the expected value function is related to the number of the third source symbols and the second degree distribution.

In an embodiment of the invention, the second degree distribution satisfies an additional limitation, and the additional limitation includes: a sum of a plurality of components in the second degree distribution is one, and each of the components is greater than a non-negative value.

In an embodiment of the invention, the additional limitation includes:

$$\left(1-\frac{E}{K}\right)^N$$

is greater than 0 and smaller than a specific value, where K is the size of the second block, E is an expected value corresponding to the second degree distribution, N is the number of a plurality of third encoded symbols required by the receiving node for decoding the second source symbols of the second block, where K, E and N are all non-negative values, and N is greater than or equal to K.

The invention provides a data transmission system, which is adapted to use a LT Code to implement communication, and the data transmission system includes a sending node and a receiving node. When the sending node and the receiving node perform a first data transmission, the sending node receives a parameter from the receiving node, where the parameter is related to a hardware specification of the receiving node. The sending node determines a size of a first block and a first degree distribution corresponding to the size of the first block according to the parameter, where the first block includes a plurality of first source symbols. The sending node generates a plurality of first encoded symbols from the first block according to the first block and the first degree distribution, and transmits the first encoded symbols to the receiving node. When the receiving node receives a plurality of second encoded symbols in the first encoded symbols from the sending node, and the receiving node decodes the first source symbols according to the second encoded symbols, the receiving node sends a notification message to the sending node to notify the sending node to end the first data transmission. When the sending node receives the notification message, the sending node determines a size of a second block and a second degree distribution corresponding to the size of the second block according to the number of the sent first encoded symbols and a simulation value corresponding to the size of the first block, and transmits the second degree distribution to the receiving node. The sending node and the receiving node perform a second data transmission by using the second degree distribution.

In an embodiment of the invention, the simulation value is generated by the sending node in advance through statistics, and the simulation value represents the number of the second encoded symbols required by the receiving node for decoding the first source symbols of the first block.

In an embodiment of the invention, in the operation of determining the size of the second block and the second degree distribution corresponding to the size of the second block according to the number of the sent first encoded symbols and the simulation value corresponding to the size of the first block, the sending node calculates a channel loss rate of a channel between the sending node and the receiving node according to the number of the sent first encoded symbols and the simulation value corresponding to the size of the first block, and the sending node determines the size of the second block according to the channel loss rate, and determines the second degree distribution according to the size of the second block.

In an embodiment of the invention, the sending node pre-stores a plurality of degree distributions in a look-up table of the sending node, where in the operation of determining the size of the second block according to the channel loss rate, and determining the second degree distribution according to the size of the second block, the sending node determines the second degree distribution from the look-up table according to the size of the second block.

In an embodiment of the invention, in the operation of determining the size of the second block by the sending node according to the channel loss rate, and determining the second degree distribution according to the size of the second block, the sending node obtains the second degree distribution according to a ripple variation function and an expected value function, where the ripple variation function is related to the number of third source symbols in a plurality of second source symbols of the second block decoded by the receiving node, and the expected value function is related to the number of the third source symbols and the second degree distribution.

In an embodiment of the invention, the second degree distribution satisfies an additional limitation, and the additional limitation includes: a sum of a plurality of components in the second degree distribution is one, and each of the components is greater than a non-negative value.

In an embodiment of the invention, the additional limitation includes:

$$\left(1-\frac{E}{K}\right)^N$$

is greater than 0 and smaller than a specific value, where K is the size of the second block, E is an expected value corresponding to the second degree distribution, N is the number of a plurality of third encoded symbols required by the receiving node for decoding the second source symbols of the second block, where K, E and N are all non-negative values, and N is greater than or equal to K.

According to the above description, the invention provides a method and system for data transmission, by which under the LT Code architecture, the sending node selects a corresponding block size according to a condition of the channel, and determines the corresponding degree distribution according to the block size for the subsequent data transmission, so as to effectively optimize the decoding efficiency and decoding complexity of the receiving node.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
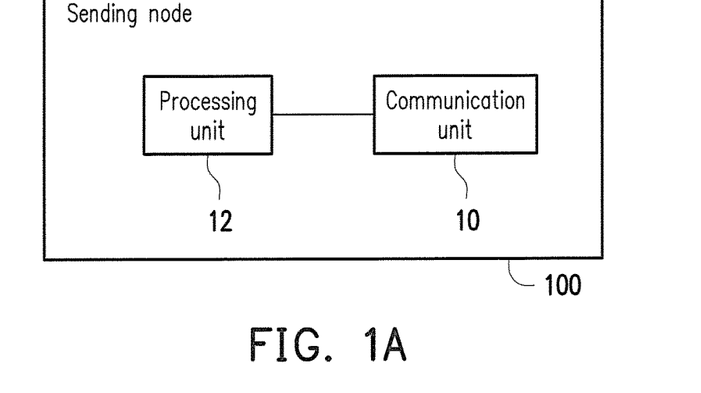
FIG. 1A is a block diagram of a sending node according to an embodiment of the invention.

FIG. 1A is a block diagram of a sending node according to an embodiment of the invention. Referring to FIG. 1A, the sending node 100 of the present embodiment includes a communication unit 10 and a processing unit 12. The sensing node 100 is, for example, an electronic device such as a mobile phone, a tablet personal computer (PC), a notebook computer, etc., which is not limited by the invention.

The communication unit 10 may support at least one of the following wireless signal transmission techniques: a global system for mobile communication (GSM) system, a personal handy-phone system (PHS), code division multiple access (CDMA), wireless fidelity (Wi-Fi), Wi-Fi direct, worldwide interoperability for microwave access (Wi-MAX), Bluetooth, radio repeater or radio broadcaster, though the invention is not limited thereto. In the present embodiment, the communication unit 10 is used for communicating with other electronic devices.

The processing unit 12 is connected to the communication unit 10. The processing unit 12 can be a central processing unit (CPU), or other programmable general purpose or special purpose microprocessor, a digital signal processor (DSP), a programmable controller, an application specific integrated circuit (ASIC) or other types of devices or a combination of the above devices. In the present embodiment, the processing unit 12 is used for accessing or executing modules recorded in a storage unit (not shown) of the sending node 100, so as to implement the data transmission method of the invention. The modules are, for example, program codes stored in the storage unit, and the storage unit can be any type of fixed or movable random access memory (RAM), a read-only memory (ROM), a flash memory or a similar device or a combination of the above devices.

Figure 1B:
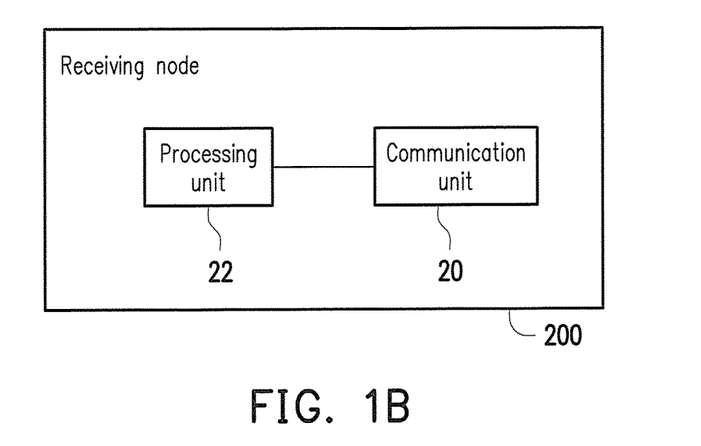
FIG. 1B is a block diagram of a receiving node according to an embodiment of the invention.

FIG. 1B is a block diagram of a receiving node according to an embodiment of the invention. Referring to FIG. 1B, the receiving node 200 of the present embodiment includes a communication unit 20 and a processing unit 22. The receiving node 200 is, for example, an electronic device such as a mobile phone, a tablet PC, a notebook computer, etc., which is not limited by the invention. Moreover, the communication unit 20 and the processing unit 22 of the receiving node 200 can be respectively similar to the communication unit 10 and the processing unit 12 of the aforementioned sending node 100, so that details thereof are not repeated. Particularly, in the present embodiment, the processing unit 22 is used for accessing or executing modules recorded in a storage unit (not shown) of the receiving node 200, so as to implement the data transmission method of the invention.

Figure 2:
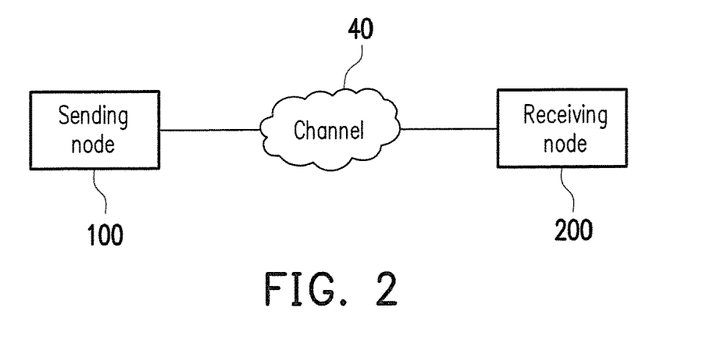
FIG. 2 is a schematic diagram of a data transmission system according to an embodiment of the invention.

FIG. 2 is a schematic diagram of a data transmission system according to an embodiment of the invention.

Referring to FIG. 2, when the sending node 100 is about to transmit data to the receiving node 200, the sending node 100 and the receiving node 200 may implement the data transmission method of the invention through a channel 40. The sending node 100 and the receiving node 200 are data transmission system using LT Code to implement communication.

Figure 3:
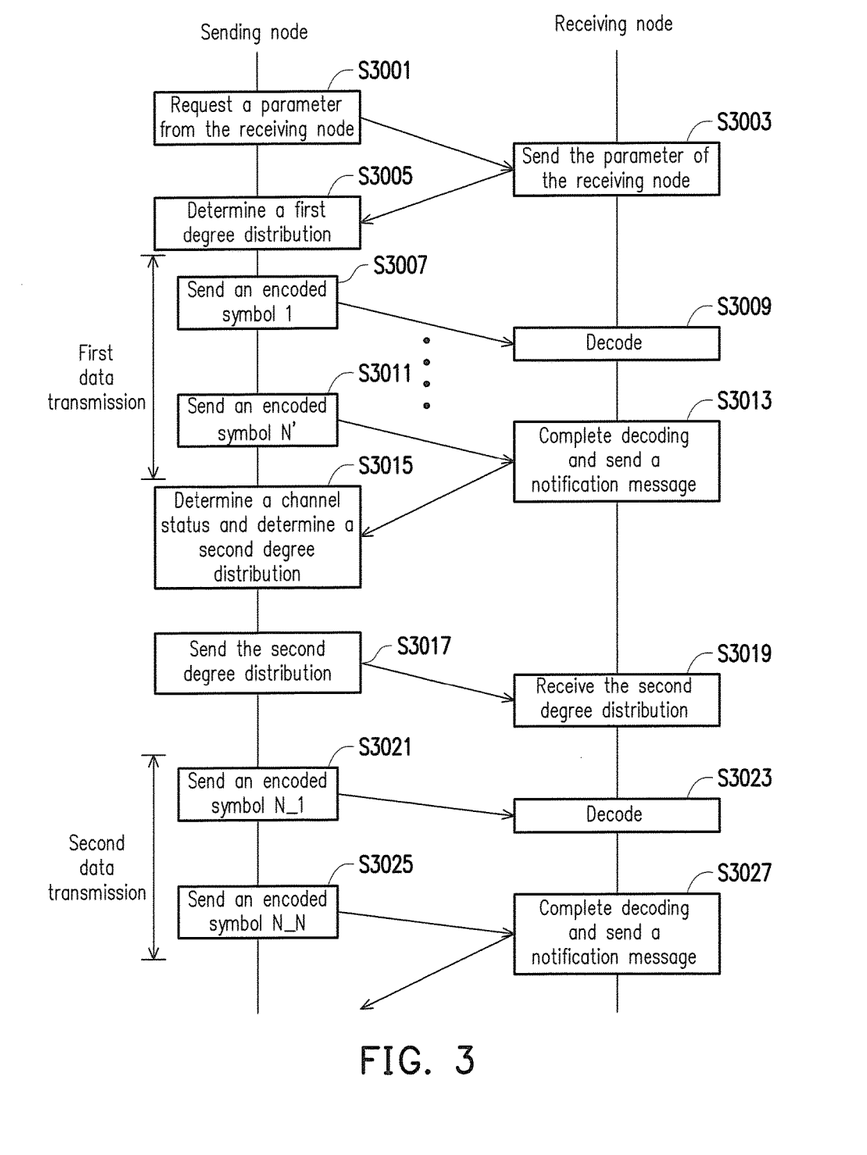
FIG. 3 is a schematic diagram of data transmission performed between a sending node and a receiving node according to an embodiment of the invention.

FIG. 3 is a schematic diagram of data transmission performed between the sending node and the receiving node according to an embodiment of the invention.

Referring to FIG. 3, in the present exemplary embodiment, when the sending node 100 and the receiving node 200 want to perform data transmission (which is referred to as a first data transmission), the sending node 100 and the receiving node 200 first have to establish a connection. During an initial phase of the connection, as shown in step S3001, the sending node 100 may send a request notification to request the receiving node 200 for a parameter, where the parameter is related to a hardware specification of the receiving node 200. The hardware specification can be a size of a memory of the receiving node 200 or the number of encoded symbols that can be processed by the receiving node 200 within a unit time (i.e. a processing speed of the receiving node 200), which is not limited by the invention.

Then, in step S3003, the receiving node 200 may send the parameter related to the hardware specification of the receiving node 200 to the sending node 100.

When the sending node 100 receives the parameter related to the hardware specification of the receiving node 200 from the receiving node 200, in step S3005, the sending node 100 determines a size of a block (which is referred to as a first block hereinafter) and a first degree distribution corresponding to the size of the first block according to the parameter of the receiving node 200, where the first block includes a plurality of first source symbols.

To be specific, during an encoding process of the LT Code, the sending node 100 may divide data to be transmitted into a plurality of source symbols, and arbitrarily select a number (which is greater than 0 and is smaller than or equal to the number of the source symbols) of the source symbols from the source symbols to perform encoding to generate encoded symbols for transmission. Each of the source symbols is data with a fixed length, and the length is determined by the user. It should be noted that the plurality of source symbols can be collectively referred to as one block, and the size of the block represents the number of the source symbols. In the present exemplary embodiment of the invention, before the encoded symbols are sent, the sending node 100 determines the size of the first block (i.e. the number of the source symbols) for the first data transmission according to the parameter of the receiving node 200. An optimal correspondence between the parameter of the receiving node 200 and the size of the first block can be obtained through mathematic calculation.

Then, in step S3005, the sending node 100 determines the first degree distribution corresponding to the size of the first block according to the determined size of the first block. It should be noted that in the exemplary embodiment of the invention, the first degree distribution corresponding to the size of the first block can be determined through a look-up table according to a table look-up method, where establishment of the look-up table is described later.

Then, in steps S3007-S3011, the sending node 100 divides data to be sent into a plurality of source symbols (which is referred to as first source symbols hereinafter) according to the size of the first block, and arbitrarily selects a number (which is greater than 0 and is smaller than or equal to the number of the source symbols) of the source symbols from the source symbols to perform encoding according to the first degree distribution, so as to generate encoded symbols 1-N' (which is referred to as first encoded symbols hereinafter) for transmission. The sending node 100 sequentially sends the generated encoded symbols 1-N' to the receiving node 200. Each time when the receiving node 200 receives one of the encoded symbols 1-N' sent by the sending node 100, the receiving node 200 starts to decode the received encoded symbols. The decoding method can be belief-propagation decoding.

When the receiving node 200 receives a plurality of encoded symbols (which are referred to as second encoded symbols hereinafter) in the encoded symbols 1-N' from the sending node 100, and the receiving node 200 decodes the first source symbols according to the second encoded symbols, in step S3013, the receiving node 200 sends a notification message to the sending node 100 to notify the sending node 100 to end the first data transmission. Particularly, since when the encoded symbols 1-N' are transmitted in the channel 40 between the sending node 100 and the receiving node 200, it may have a data loss or an error, the number of the second encoded symbols actually received by the receiving node 200 is smaller than or equal to the number of the encoded symbols 1-N' actually sent by the sending node 100.

When the sending node 100 receives the notification message from the receiving node 200, in step S3015, the sending node 100 determines a size of a second block and a second degree distribution corresponding to the size of the second block according to the number of the sent encoded symbols 1-N' (i.e. the number of the first encoded symbols) and a simulation value corresponding to the size of the first block, where the simulation value is a random variable generated by the sending node 100 in advance according to probability function or statistical features, and the simulation value represents the number of the second encoded symbols required by the receiving node 100 for decoding the first source symbols of the first block.

To be specific, the sending node 100 calculates a channel loss rate of the channel 40 between the sending node 100 and the receiving node 200 according to the number of the sent first encoded symbols and the simulation value corresponding to the size of the first block, where a method for calculating the channel loss rate is to quantify a difference between the number of the first encoded symbols and the simulation value corresponding to the size of the first block. Then, the sending node 100 determines the size of the second block for a next data transmission (which is referred to as a second data transmission) according to the calculated channel loss rate, and looks up a table according to the size of the second block or perform a real-time calculation to determine the second degree distribution.

For example, it is determined that the number of the first encoded symbols actually sent by the sending node 100 is N', and the simulation value is N, where N' and N are all positive integers, where a value of (N'-N) can be used to estimate the number of the damaged or lost encoded symbols in the first data transmission. Namely, the value of (N'-N) can be used to serve as the channel loss rate of the first data transmission. Then, the sending node 100 may calculate the size (which is represented by a K value) of the second block used for the second data transmission according to the channel loss rate, i.e. the number of the second source symbols used for the second data transmission, where K is an integer greater than 0. The method for calculating the K value is as follows.

Method one:

If N'-E[N]>$T_2$, the K value is decreased; and if N'-E[N] >$T_1$, the K value is increased; and otherwise the K value is maintained to be equal to the size of the first block, where E[N] represents an expected value of N, and $T_1$ and $T_2$ can be customized variables.

Method two:

K←max(K+α(N'-E(N), $K_0$)); where E[N] represents the expected value of N, and α and $K_0$ are constants.

Method three: a value is sampled form the distribution of the random variable K+β(N'-N) to serve as the K value of the second data transmission, where β is a constant.

After the K value of the size of the second block to be used in the second data transmission is determined according to one of the aforementioned method one to method three, the sending node 100 defines a ripple variation function μ(ρ) suitable for the belief-propagation decoding according to the parameter related to the hardware specification of the receiving node 200, where the ripple variation function μ(ρ) can be deduced according to a following equation:

$$\mu(\rho) = \alpha \ln\left(\frac{K-\rho}{\delta}\right)\sqrt{K-\rho} + \beta$$

Where K represents the size of the second block, ρ represents the number of the second source symbols decoded by the receiving node 200, i.e. ρ=0, 1, . . . , K−1. In other words, ρ is a part of the source symbols (which are referred to as third source symbols) in the second source symbols decoded by the receiving node 200; δ represents an upper limit of a decoding failure rate of the receiving node 200; and α and β are adjustable constants.

Then, the sending node 100 may obtain an optimal solution of a following target function to obtain the second degree distribution of the second data transmission:

$$\Omega_{new} = \underset{\Omega}{\operatorname{argmin}} \frac{1}{K} \sum_{d=1}^{K-1} [R(\Omega, \rho) - \mu(\rho)]^2 + p(\Omega) \quad (1)$$

$$\text{s.t.} \sum_d^K \Omega_d = 1, \Omega_d \geq \gamma \geq 0$$

$$R(\Omega, \rho) = (1+\varepsilon) \sum_{d=1}^{K} \left[\Omega_d (K-\rho)^d \left(\frac{\rho}{K}\right)^{d-1} + \frac{K-\rho}{1+\varepsilon} \ln \frac{K-\rho}{K}\right] \quad (2)$$

Where, $$\varepsilon = E\left[\frac{N-K}{K}\right];$$

$\Omega = \{\Omega_d; d=1, 2, \ldots, K\}$; and $p(\Omega)$ is an additional limitation to the second degree distribution, which can be defined according to different requirement. For example, $$p(\Omega) = \sum_{d=1}^{K} |\Omega_d|$$

can make the target function to find solutions with more subentries of 0 from the second degree distribution.

In brief, according to the aforementioned equation (1) and equation (2), the sending node 100 may find one degree distribution Ω to minimize a difference between the ripple variation function μ(ρ) and an expected value function R(Ω,ρ), and a sum of a plurality of components in the degree distribution Ω is one, where each of the components is greater than one and is a non-negative value. Namely, when the sending node 100 find the degree distribution Ω satisfying the aforementioned conditions, the sending node 100 sets the degree distribution as a second degree distribution $\Omega_{new}$ for the second data transmission.

Moreover, the second degree distribution $\Omega_{new}$ is also required to satisfy that $$\left(1 - \frac{E}{K}\right)^N$$

is greater than 0 and smaller than a specific value, where K is the size of the second block, E is an expected value corresponding to the second degree distribution $\Omega_{new}$, N is the number of a plurality of encoded symbols (which are referred to as third encoded symbols hereinafter) required by the receiving node 200 for decoding the second source symbols of the second block, where K, E and N are all non-negative values, and N is greater than or equal to K.

In brief, the sending node 100 obtains the second degree distribution according to the ripple variation function μ(ρ) and the expected value function R(Ω,ρ), where the ripple variation function μ(ρ) is related to the number ρ of a part of the source symbols (i.e. the third source symbols) in the second source symbols of the second block decoded by the receiving node 200, and the expected value function R(Ω,ρ) is related to the number ρ of the third source symbols and the degree distribution Ω to be found by the equation (1) (i.e. the second degree distribution to be found).

It should be noted that the aforementioned equation (1) and equation (2) can be calculated in advance, and a plurality of K values and the degree distribution corresponding to each of the K values are stored in a look-up table of the storage unit of the sending node 100. After the sending node 100 obtains the K value representing the size of the second block according to the aforementioned method one to method three, the sending node 100 may directly find the corresponding second degree distribution from the look-up table for applying to the second data transmission according to the size of the second block (the K value). Moreover, the simulation value corresponding to each of the degree distributions (i.e. the number of the encoded symbols required to be received by the receiving node for decoding the source symbols) can also be calculated and simulated in advance by the sending node 100 for generating and recording in the look-up table of the sending node 100. However, the invention is not limited thereto, and the step of determining the second degree distribution according to the K value can also be performed by the sending node 100 through real-time calculation after the sending node 100 receives the notification message from the receiving node 200, which is not limited by the invention.

After the sending node 100 determines the size of the second block and the second degree distribution corresponding to the size of the second block, in step S3017, the sending node 100 sends the obtained second degree distribution to the receiving node 200, and in step S3019, the receiving node 200 receives the second degree distribution sent by the sending node 100.

Then, in step S3021-step S3025, the sending node 100 and the receiving node 200 may use the second degree distribution to perform the second data transmission. For example, the sending node 100 divides the data to be transmitted into a plurality of source symbols (which are referred to as second source symbols) according to the determined size of the second block, and selects an arbitrary number (which is greater than 0 and smaller than or equal to the number of the source symbols) of the source symbols from the source symbols to perform encoding, so as to generate encoded symbols N_1-N_N for sending. The sending node 100 sequentially sends the generated encoded symbols N_1-N_N to the receiving node 200. Each time when the receiving node 200 receives one of the encoded symbols N_1-N_N sent by the sending node 100, the receiving node 200 starts to decode the received encoded symbols.

Then, when the receiving node 200 receives a plurality of encoded symbols (which are referred to as third encoded symbols hereinafter) in the encoded symbols N_1-N_N from the sending node 100, and the receiving node 200 decodes the aforementioned second source symbols according to the third encoded symbols, in step S3027, the receiving node 200 sends a notification message to the sending node 100 to notify the sending node 100 to end the second data transmission. Then, the sending node 100 may repeat the aforementioned steps S3015-S3027 to perform subsequent data transmission.

Figure 4:
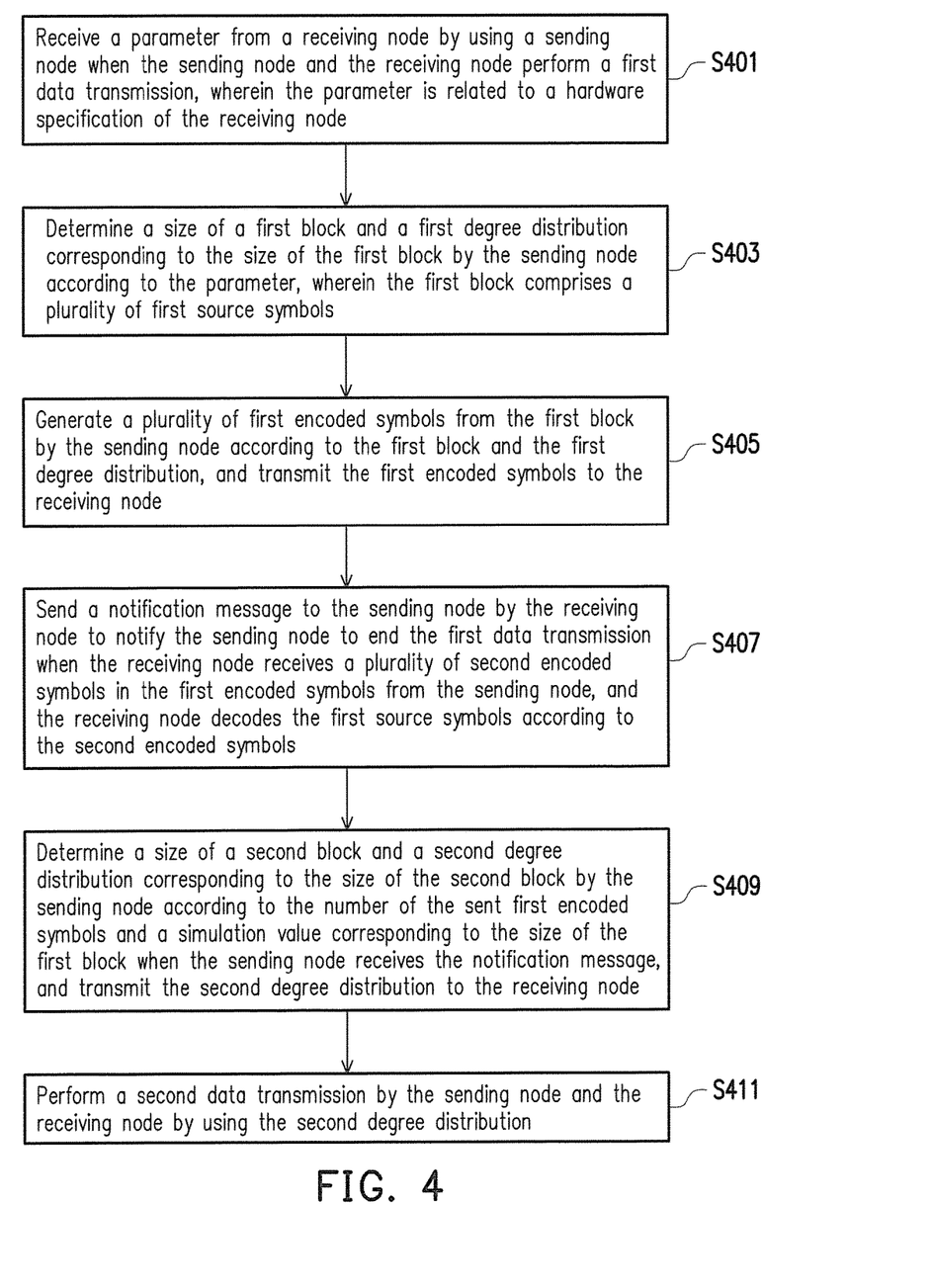
FIG. 4 is a flowchart illustrating a data transmission method according to an embodiment of the invention.

FIG. 4 is a flowchart illustrating a data transmission method according to an embodiment of the invention.

Referring to FIG. 4, in step S401, when the sending node 100 and the receiving node 200 perform a first data transmission, the sending node 100 receives a parameter from the receiving node 200, where the parameter is related to a hardware specification of the receiving node 200. Then, in step S403, the sending node 100 determines a size of a first block and a first degree distribution corresponding to the size of the first block according to the parameter, where the first block includes a plurality of first source symbols. In step S405, the sending node 100 generates a plurality of first encoded symbols from the first block according to the first block and the first degree distribution, and transmits the first encoded symbols to the receiving node 200. In step S407, when the receiving node 200 receives a plurality of second encoded symbols in the first encoded symbols from the sending node 100, and the receiving node 200 decodes the first source symbols according to the second encoded symbols, the receiving node 200 sends a notification message to the sending node 100 to notify the sending node 100 to end the first data transmission. In step S409, when the sending node 100 receives the notification message, the sending node 100 determines a size of a second block and a second degree distribution corresponding to the size of the second block according to the number of the sent first encoded symbols and a simulation value corresponding to the size of the first block, and transmits the second degree distribution to the receiving node 200. Then, in step S411, the sending node 100 and the receiving node 200 perform a second data transmission by using the second degree distribution.

In summary, the invention provides a method and system for data transmission, by which under the LT Code architecture, the sending node selects a corresponding block size according to a condition of the channel, and determines the corresponding degree distribution according to the block size for the subsequent data transmission, so as to effectively optimize the decoding efficiency and decoding complexity of the receiving node.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data transmission method, adapted to a data transmission system using a Luby transform code to implement communication, the data transmission method comprising:
   receiving a parameter from a receiving node by using a sending node when the sending node and the receiving node perform a first data transmission, wherein the parameter is related to a hardware specification of the receiving node, and the hardware specification is a size of a memory of the receiving node or a processing speed of the receiving node;
   determining a size of a first block and a first degree distribution corresponding to the size of the first block by the sending node according to the parameter, wherein the first block comprises a plurality of first source symbols;
   generating a plurality of first encoded symbols from the first block by the sending node according to the first block and the first degree distribution, and transmitting the first encoded symbols to the receiving node;
   sending a notification message to the sending node by the receiving node to notify the sending node to end the first data transmission when the receiving node receives a plurality of second encoded symbols in the first encoded symbols from the sending node, and the receiving node decodes the first source symbols according to the second encoded symbols;
   detemining a size of a second block and a second degree distribution corresponding to the size of the second block by the sending node according to the number of the sent first encoded symbols and a simulation value corresponding to the size of the first block when the sending node receives the notification message, and transmitting the second degree distribution to the receiving node; and
   performing a second data transmission by the sending node and the receiving node by using the second degree distribution.

2. The data transmission method as claimed in claim 1, wherein the simulation value is generated by the sending node in advance through statistics, and the simulation value represents the number of the second encoded symbols required by the receiving node for decoding the first source symbols of the first block.

3. The data transmission method as claimed in claim 1, wherein the step of determining the size of the second block and the second degree distribution corresponding to the size of the second block according to the number of the sent first encoded symbols and the simulation value corresponding to the size of the first block further comprises:
   calculating a channel loss rate of a channel between the sending node and the receiving node by the sending node according to the number of the sent first encoded symbols and the simulation value corresponding to the size of the first block; and
   determining the size of the second block by the sending node according to the channel loss rate, and determining the second degree distribution according to the size of the second block.

4. The data transmission method as claimed in claim 3, wherein the sending node pre-stores a plurality of degree distributions in a look-up table of the sending node,
   wherein the step of determining the size of the second block according to the channel loss rate, and determining the second degree distribution according to the size of the second block further comprises:
   determining the second degree distribution by the sending node from the look-up table according to the size of the second block.

5. The data transmission method as claimed in claim 3, wherein the step of determining the size of the second block by the sending node according to the channel loss rate, and determining the second degree distribution according to the size of the second block further comprises:
   obtaining the second degree distribution by the sending node according to a ripple variation function and an expected value function, wherein the ripple variation function is related to the number of third source symbols in a plurality of second source symbols of the second block decoded by the receiving node, and the expected value function is related to the number of the third source symbols and the second degree distribution.

6. The data transmission method as claimed in claim 5, wherein the second degree distribution satisfies an additional limitation, and the additional limitation comprises:
   a sum of a plurality of components in the second degree distribution is one, and each of the components is greater than a non-negative value.

7. The data transmission method as claimed in claim 6, wherein the additional limitation further comprises:
   satisfying that $$\left(1 - \frac{E}{K}\right)^N$$

is greater than 0 and smaller than a specific value, wherein K is the size of the second block, E is an expected value corresponding to the second degree distribution, N is the number of a plurality of third encoded symbols required by the receiving node for decoding the second source symbols of the second block, wherein K, E and N are all non-negative values, and N is greater than or equal to K.

8. A data transmission system, adapted to use a Luby transform Code to implement communication, and the data transmission system comprising:
   a sending node; and
   a receiving node, wherein
   when the sending node and the receiving node perform a first data transmission, the sending node receives a parameter from the receiving node, wherein the parameter is related to a hardware specification of the receiving node, and the hardware specification is a size of a memory of the receiving node or a processing speed of the receiving node,
   the sending node determines a size of a first block and a first degree distribution corresponding to the size of the first block according to the parameter, wherein the first block comprises a plurality of first source symbols, the sending node generates a plurality of first encoded symbols from the first block according to the first block and the first degree distribution, and transmits the first encoded symbols to the receiving node, when the receiving node receives a plurality of second encoded symbols in the first encoded symbols from the sending node, and the receiving node decodes the first source symbols according to the second encoded symbols, the receiving node sends a notification message to the sending node to notify the sending node to end the first data transmission, when the sending node receives the notification message, the sending node determines a size of a second block and a second degree distribution corresponding to the size of the second block according to the number of the sent first encoded symbols and a simulation value corresponding to the size of the first block, and transmits the second degree distribution to the receiving node, and the sending node and the receiving node perform a second data transmission by using the second degree distribution.

9. The data transmission system as claimed in claim 8, wherein the simulation value is generated by the sending node in advance through statistics, and the simulation value represents the number of the second encoded symbols required by the receiving node for decoding the first source symbols of the first block.

10. The data transmission system as claimed in claim 8, wherein in the operation of determining the size of the second block and the second degree distribution corresponding to the size of the second block according to the number of the sent first encoded symbols and the simulation value corresponding to the size of the first block, the sending node calculates a channel loss rate of a channel between the sending node and the receiving node according to the number of the sent first encoded symbols and the simulation value corresponding to the size of the first block, and the sending node determines the size of the second block according to the channel loss rate, and determines the second degree distribution according to the size of the second block.

11. The data transmission system as claimed in claim 10, wherein the sending node pre-stores a plurality of degree distributions in a look-up table of the sending node, wherein in the operation of determining the size of the second block according to the channel loss rate, and determining the second degree distribution according to the size of the second block, the sending node determines the second degree distribution from the look-up table according to the size of the second block.

12. The data transmission system as claimed in claim 10, wherein in the operation of determining the size of the second block by the sending node according to the channel loss rate, and determining the second degree distribution according to the size of the second block, the sending node obtains the second degree distribution according to a ripple variation function and an expected value function, wherein the ripple variation function is related to the number of third source symbols in a plurality of second source symbols of the second block decoded by the receiving node, and the expected value function is related to the number of the third source symbols and the second degree distribution.

13. The data transmission system as claimed in claim 12, wherein the second degree distribution satisfies an additional limitation, and the additional limitation comprises:

a sum of a plurality of components in the second degree distribution is one, and each of the components is greater than a non-negative value.

14. The data transmission system as claimed in claim 13, wherein the additional limitation further comprises:

satisfying that $$\left(1 - \frac{E}{K}\right)^N$$

is greater than 0 and smaller than a specific value, wherein K is the size of the second block, E is an expected value corresponding to the second degree distribution, N is the number of a plurality of third encoded symbols required by the receiving node for decoding the second source symbols of the second block, wherein K, E and N are all non-negative values, and N is greater than or equal to K.

* * * * *